United States Patent
Saito et al.

(10) Patent No.: US 10,700,682 B2
(45) Date of Patent: Jun. 30, 2020

(54) HIGH-FREQUENCY SWITCH

(71) Applicant: Mitsubishi Electric Corporation, Chiyoda-ku (JP)

(72) Inventors: Tetsunari Saito, Tokyo (JP); Ryota Komaru, Tokyo (JP); Kazuhiko Nakahara, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/499,622

(22) PCT Filed: Mar. 5, 2018

(86) PCT No.: PCT/JP2018/008348
§ 371 (c)(1),
(2) Date: Sep. 30, 2019

(87) PCT Pub. No.: WO2018/190034
PCT Pub. Date: Oct. 18, 2018

(65) Prior Publication Data
US 2020/0044651 A1     Feb. 6, 2020

(30) Foreign Application Priority Data

Apr. 10, 2017   (JP) .................................. 2017-077619

(51) Int. Cl.
*H03G 3/00* (2006.01)
*H03K 17/693* (2006.01)
*H03K 17/95* (2006.01)

(52) U.S. Cl.
CPC ....... *H03K 17/693* (2013.01); *H03K 17/9537* (2013.01)

(58) Field of Classification Search
CPC .... H03G 3/001; H03G 3/3052; H03G 3/3036; H03G 3/3084; H03G 1/0088; H03G 1/0023; H03K 3/287
See application file for complete search history.

(56) References Cited

U.S. PATENT DOCUMENTS

2013/0169365 A1* 7/2013 Lee ...................... H03G 1/0082
330/282

FOREIGN PATENT DOCUMENTS

JP         2013-98771 A      5/2013

OTHER PUBLICATIONS

International Search Report dated May 15, 2018 in PCT/JP2018/008348 filed on Mar. 5, 2018.

(Continued)

*Primary Examiner* — Sibin Chen
(74) *Attorney, Agent, or Firm* — Oblon, McClelland, Maier & Neustadt, L.L.P.

(57) ABSTRACT

A high-frequency switch includes: a first transistor connected to an input terminal and a first output terminal; a second transistor connected to the first output terminal; a third transistor connected to the second transistor and grounded; a resistor connected to a connection between the second and third transistors and grounded; a switching circuit switchable between a state in which the switching circuit allows passage of a transmitted/received signal between the input terminal and a second output terminal and a state in which the switching circuit cuts off the transmitted/received signal; and a control unit to control the first, second, and third transistors and the switching circuit. At the time of reception, the control unit brings the switching circuit into the state in which the switching circuit cuts off the transmitted/received signal, places the first and third transistors in an on-state, and places the second transistor in an off-state.

(Continued)

At the time of transmission and reception with an automatic gain control operation, the control unit brings the switching circuit into the state in which the switching circuit allows the passage of the transmitted/received signal, brings the first and third transistors in an off-state, and brings the second transistor in an on-state.

4 Claims, 5 Drawing Sheets

(56) References Cited

OTHER PUBLICATIONS

European Search Report dated Mar. 14, 2019 in European Application No. 18 78 5220.
Hangai, M. et al., "An X-band 50% Bandwidth High-Power GaN HEMT T/R Switch", Proceedings of Asia-Pacific Microwave Conference, 2010, pp. 135-138.

* cited by examiner

HIGH-FREQUENCY SWITCH

FIELD

The present invention relates to a high-frequency switch.

BACKGROUND

A system such as a radar uses an common antenna for the transmission and the reception. Such a system is designed such that a transmitter and receiver module including a high-frequency switch is defined by a transmitting circuit and a receiving circuit. Input and output terminals of the antenna, an input terminal of the receiving circuit, and an output terminal of the transmitting circuit are connected to one another by a circulator.

In the receiving circuit of the transmitter and receiver module described above, the high-frequency switch has its input terminal connected to the circulator. The high-frequency switch also has a first output terminal connected to an LNA (Low Noise Amplifier), and a second output terminal connected to a termination. At the time of reception of a signal, the high-frequency switch serves a function of allowing the signal to pass between the input terminal and the first output terminal, such that the received signal is output to the LNA at a stage following the high-frequency switch. At the time of transmission of a signal, the high-frequency switch serves a function of allowing the signal to pass between the input terminal and the second output terminal, such that the signal leaking via the circulator or the transmitted signal reflected from the antenna is output to the termination connected to the second output terminal, with the result that the LNA at the following stage is protected from the transmitted signal.

Further, power of a received signal input to the transmitter and receiver module significantly varies depending upon a distance between the radar and a target. When the power of the received signal is large, it is thought that an automatic gain control (hereinafter, "AGC") circuit for adjusting power should be provided at a stage preceding the LNA or the high-frequency switch itself should have an AGC function in order to prevent the LNA from being broken down due to excessive power input to the LNA. When the high-frequency switch is used as the AGC circuit, the high-frequency switch is required to have a function of providing blockade between the input terminal and the first output terminal such that a received signal is sufficiently attenuated due to isolation of the high-frequency switch and is output to the LNA.

In a high-frequency switch having a circuit configuration illustrated in FIG. 1 of Patent Literature 1, all of the transistors are in an off-state when a signal is received, and all of the transistors are in an on-state when a signal is transmitted. Referring to FIG. 1 of Patent Literature 1, at the time of transmission of a signal, an on-resistance of a transistor $2c$ is small enough to be considered as being short-circuited when the high-frequency switch is viewed from an input/output terminal $1c$ connected to an LNA. As a result, total reflection from the high-frequency switch as the high-frequency switch is viewed from the input/output terminal $1c$ connected to the LNA occurs, which causes degradation of receiving characteristics or an unstable operation of the LNA. Accordingly, the high-frequency switch having the circuit configuration illustrated in FIG. 1 of Patent Literature 1 is difficult to use as an AGC, and a separate AGC circuit is required to be provided at a stage preceding the LNA.

CITATION LIST

Patent Literature

Patent Literature 1: Japanese Patent Application Laid-open No. 2013-98771

SUMMARY

Technical Problem

As described above, when a conventional high-frequency switch illustrated in FIG. 1 of Patent Literature 1 is used as an AGC, the total reflection as viewed from a first output terminal connected to an LNA to the high-frequency switch occurs, which causes degradation of characteristics related to reception or an unstable operation of the LNA.

The present invention has been achieved in view of the above, and an object of the present invention is to provide a high-frequency switch that can reduce reflection as viewed from a terminal connected to which an LNA.

Solution to Problem

In order to solve the above problems and achieve the object, a high-frequency switch according to the present invention includes 1: a first transistor having a drain terminal connected to an input terminal, and a source terminal connected to a first output terminal; a second transistor having a drain terminal connected to the first output terminal; a third transistor having a drain terminal connected to a source terminal of the second transistor, and a grounded source terminal; a resistor having one end connected to a connection between the source terminal of the second transistor and the drain terminal of the third transistor, and another end grounded; a switching circuit connected between the input terminal and a second output terminal, the switching circuit being switchable between a state in which the switching circuit allows passage of a transmitted/received signal between the input terminal and the second output terminal and a state in which the switching circuit cuts off the transmitted/received signal; and a control unit to control the first transistor, the second transistor, the third transistor, and the switching circuit. At a time of reception without an automatic gain control operation, the control unit brings the switching circuit into the state in which the switching circuit cuts off the transmitted/received signal, places the first transistor and the third transistor in an on-state, and places the second transistor in an off-state. At a time of transmission and reception with the automatic gain control operation, the control unit brings the switching circuit into the state in which the switching circuit allows the passage of the transmitted/received signal, places the first transistor and the third transistor in an off-state, and places the second transistor in an on-state.

Advantageous Effects of Invention

The present invention achieves an effect of providing the high-frequency switch that can reduce the reflection as viewed from the terminal connected to the LNA.

DESCRIPTION OF EMBODIMENTS

A high-frequency switch according to embodiments of the present invention will be described in detail below with reference to the accompanying drawings. The present invention is not limited to the embodiments.

First Embodiment

Figure 1:
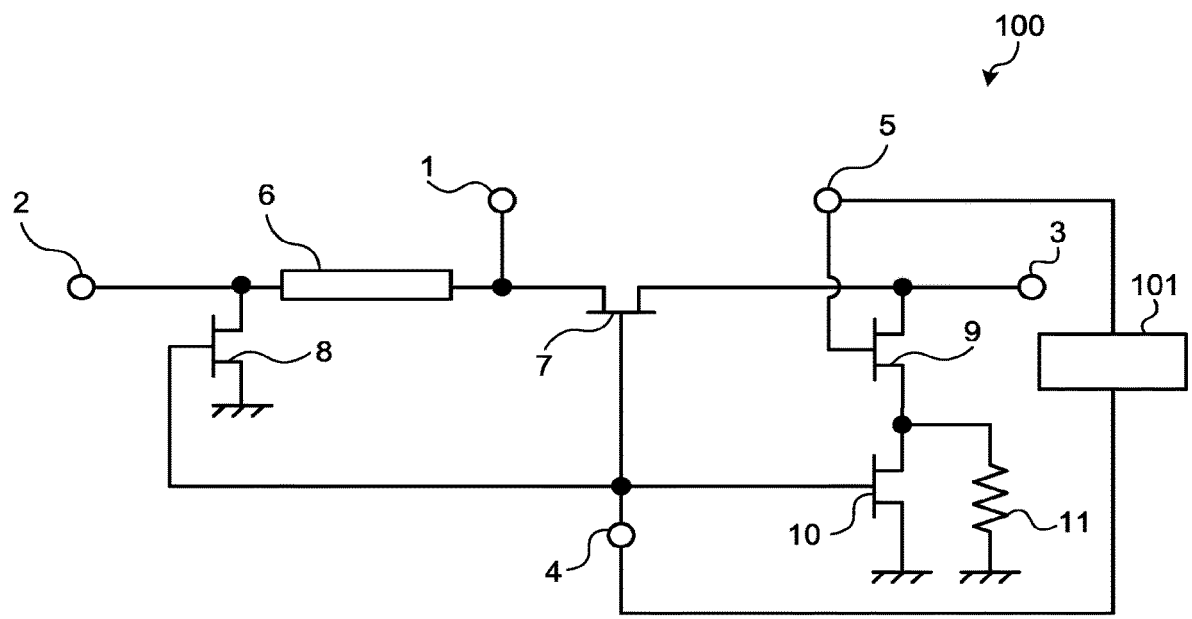
FIG. 1 is a circuit diagram illustrating a high-frequency switch according to a first embodiment of the present invention.

FIG. 1 is a circuit diagram illustrating a high-frequency switch 100 according to a first embodiment of the present invention. The high-frequency switch 100 includes transistors 7, 8, 9, and 10, a resistor 11, a transmission line 6, and a control unit 101. The transistors 7, 8, 9, and 10 are field effect transistors. The transistors 7, 8, 9, and 10 can be transistors other than field effect transistors. The control unit 101 is a control circuit that controls gate voltages of the transistors 7, 8, 9, and 10.

In FIG. 1, an input terminal 1 is connected to an antenna (not illustrated). An output terminal 3 that is a first output terminal is connected to an LNA (not illustrated). An output terminal 2 that is a second output terminal is connected to a termination (not illustrated).

One end of the transmission line 6 is connected to the input terminal 1 and the other end of the transmission line 6 is connected to the output terminal 2. A drain terminal of the transistor 7 that is a first transistor is connected to a connection between the input terminal 1 and the one end of the transmission line 6. A source terminal of the transistor 7 is connected to the output terminal 3. A drain terminal of the transistor 8 is connected to the other end of the transmission line 6 and the output terminal 2. A source terminal of the transistor 8 is grounded. A drain terminal of the transistor 9 that is a second transistor is connected to a connection between the source terminal of the transistor 7 and the output terminal 3. A source terminal of the transistor 9 is connected to a drain terminal of the transistor 10. The drain terminal of the transistor 10 that is a third transistor is connected to the source terminal of the transistor 9. A source terminal of the transistor 10 is grounded. One end of the resistor 11 is connected to a connection between the source terminal of the transistor 9 and the drain terminal of the transistor 10. The other end of the resistor 11 is grounded.

The transmission line 6 and the transistor 8 define a switching circuit connected between the input terminal 1 and the output terminal 2. The configuration of the switching circuit is not limited to one defined by the transmission line 6 and the transistor 8, as long as the switching circuit is a circuit switchable between a state in which the switching circuit allows passage of a transmitted/received signal between the input terminal 1 and the output terminal 2 and a state in which the switching circuit cuts off the transmitted/received signal. The control unit 101 controls the switching circuit to bring the switching circuit into one of the state in which the switching circuit allows the transmitted/received signal to pass between the input terminal 1 and the output terminal 2 or the state in which the switching circuit cuts off the transmitted/received signal. Specifically, the control unit 101 controls a gate voltage of the transistor 8, thereby switching the state of the switching circuit.

A control terminal 4 is connected to a gate terminal of each of the transistors 7, 8, and 10. A control terminal 5 is connected to a gate terminal of the transistor 9. The control terminal 4 and the control terminal 5 are connected to the control unit 101. The control terminal places the transistor in an on-state by applying a gate voltage equal to or higher than a pinch-off voltage to a gate terminal of the transistor, and places the transistor in an off-state by applying a gate voltage lower than the pinch-off voltage thereto. Since the transistor in the on-state can be equivalently considered as a resistor, the transistor in the on-state is hereinafter referred to as "on-resistance". Since the transistor in the off-state can be equivalently considered as a capacitor, the transistor in the off-state is hereinafter referred to as "off-capacitance".

At the time of reception without an AGC operation, the control unit 101 of the high-frequency switch 100 illustrated in FIG. 1 controls the gate voltages via the control terminal 4 and the control terminal 5, so that the transistors 7, 8, and 10 are placed in the on-state and the transistor 9 is placed in the off-state. At this time, the switching circuit described above becomes the state in which the switching circuit cuts off a transmitted/received signal. At the time of reception with the AGC operation and transmission, the control unit 101 controls the gate voltages via the control terminal 4 and the control terminal 5, thereby placing the transistors 7, 8, and 10 in the off-state and placing the transistor 9 in the on-state. At this time, the switching circuit described above becomes the state in which the switching circuit allows the passage of a transmitted/received signal.

In addition to switching between the transmission and the reception, when it is determined that power of a received signal may become excessive for an LNA at the time of the reception without the AGC operation, the control unit 101 also switches each of the transistors 7, 8, 9, and 10 between the on-state and the off-state in the manner described above in order to perform the AGC operation.

Figure 2:
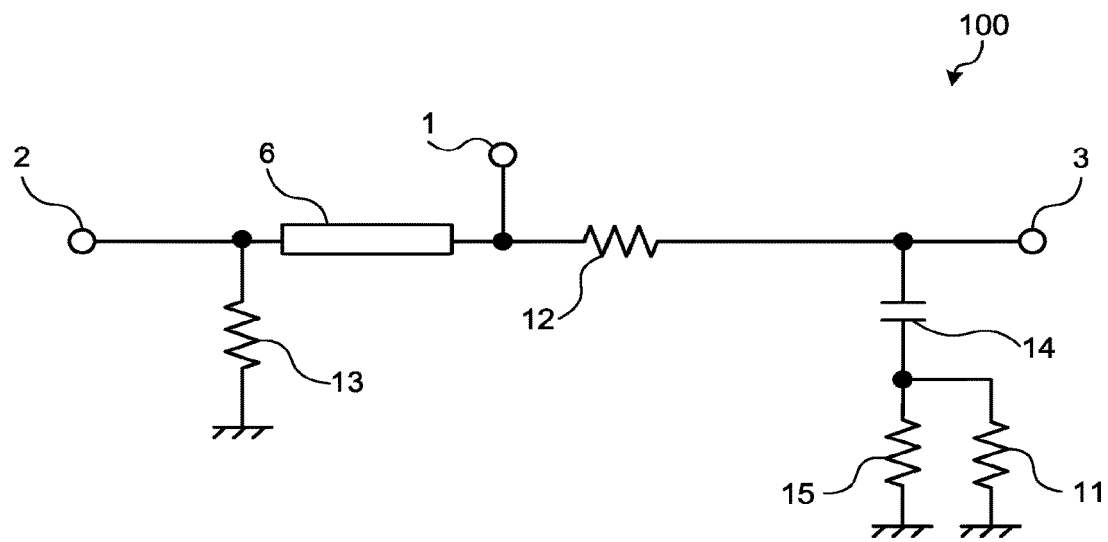
FIG. 2 is an equivalent circuit diagram of the high-frequency switch according to the first embodiment at the time of reception without an AGC operation.

FIG. 2 is an equivalent circuit diagram of the high-frequency switch 100 according to the first embodiment at the time of the reception without the AGC operation.

The transmission line 6 is set to have an electrical length of 90° at a center frequency of a transmitted/received signal.

When an on-resistance 13 of the transistor 8 is sufficiently small as compared with an impedance of the termination connected to the output terminal 2, the connected portion of the transmission line 6 to the output terminal 2 can be considered as being short-circuited and an impedance of the transmission line 6 as viewed from the input terminal 1 can be approximated to be infinite. As a result, a received signal transmitted from the input terminal 1 toward the output terminal 2 is cut off. An impedance of an off-capacitance 14 of the transistor 9 is set to be sufficiently high near the center frequency of the transmitted/received signal, such that a received signal is transmitted from the input terminal 1 to the output terminal 3.

Figure 3:
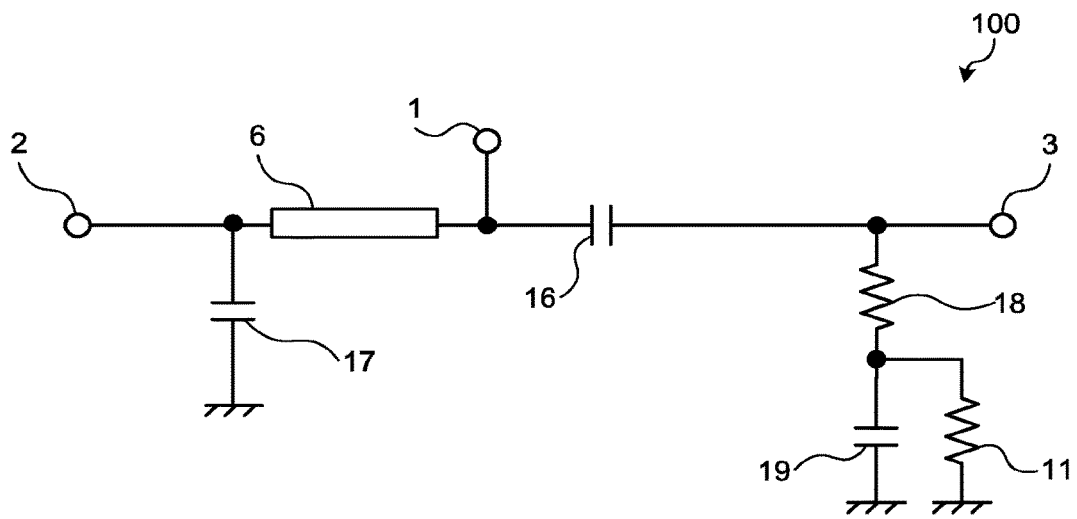
FIG. 3 is an equivalent circuit diagram of the high-frequency switch according to the first embodiment at the time of reception with the AGC operation and transmission.

FIG. 3 is an equivalent circuit diagram of the high-frequency switch 100 according to the first embodiment at the time of the reception with the AGC operation and the transmission.

Since an impedance of an off-capacitance 16 of the transistor 7 is set to be sufficiently high near a center frequency of a transmitted/received signal, the blockade between the input terminal 1 and the output terminal 3 occurs. In addition, an impedance of an off-capacitance 17 of the transistor 8 is set to be sufficiently high near the center frequency of the transmitted/received signal, thereby allowing passage of a transmitted signal from the input terminal 1 to the output terminal 2 at the time of the transmission. As a result, the transmitted signal is transmitted from the input terminal 1 to the output terminal 2. At the time of the reception with the AGC operation, a received signal is sufficiently attenuated and is transmitted to the output terminal 3.

Since an off-capacitance 19 of the transistor 10 is set to have a sufficiently high impedance near the center frequency of the transmitted/received signal, an impedance of the high-frequency switch 100 as viewed from the output terminal 3 appears to be terminated with a combined resistance of an on-resistance 18 of the transistor 9 and the resistor 11. A value of the resistor 11 is therefore determined to make the combined resistance of the on-resistance 18 and the resistor 11 equal to a characteristic impedance of an LNA, such that reflection by the high-frequency switch 100 as viewed from the output terminal 3 can be reduced.

At the time of the reception with the AGC operation, as described above, the impedance of the high-frequency switch 100 as viewed from the output terminal 3 connected to an LNA appears to be terminated with the combined resistance of the on-resistance 18 of the transistor 9 and the resistor 11. This results in an effect that reflection by the high-frequency switch 100 as viewed from the output terminal 3 connected to the LNA is not total reflection, but is reduced. For the high-frequency switch 100 of the first embodiment, namely, signals from the output terminal 3 to the high-frequency switch 100 at the time of the transmission and at the time of reception are reflected to the same degree, and the reflection of the signal by the high-frequency switch 100 as viewed from the output terminal 3 can be reduced. The high-frequency switch 100 of the first embodiment enables stable operation of the following LNA connected thereto, at the time of the reception with the AGC operation, thereby improving the receiving characteristics. Further, it is not necessary to additionally provide the high-frequency switch 100 with an additional AGC circuit. As a result, the high-frequency switch 100 is downsized due to the reduction in the scale of the circuit of the high-frequency switch 100.

Second Embodiment

Figure 4:
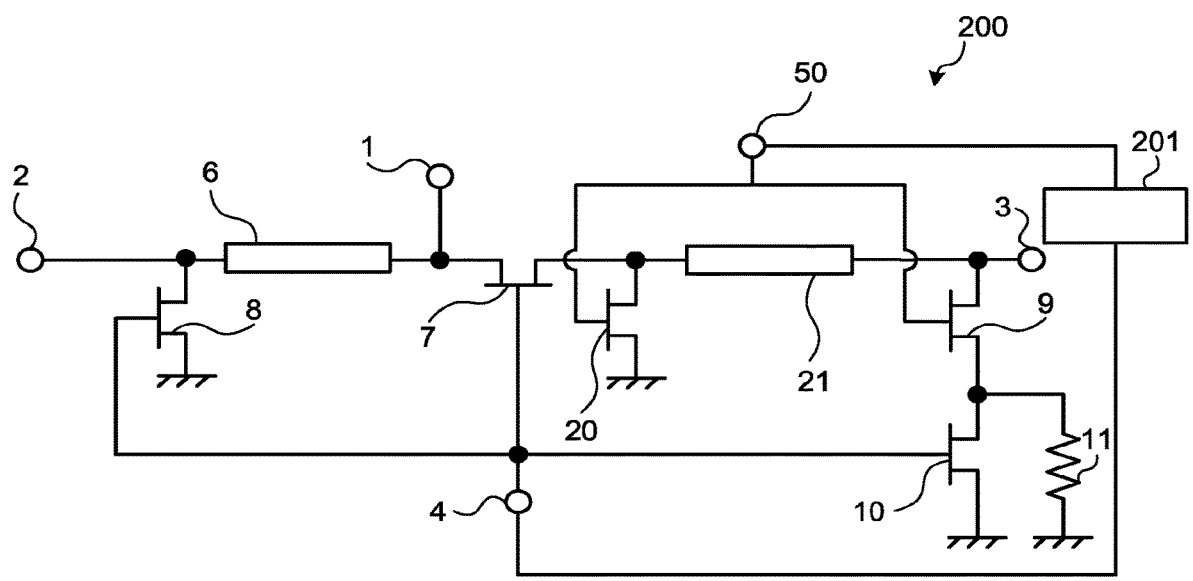
FIG. 4 is a circuit diagram illustrating a high-frequency switch according to a second embodiment of the present invention.

FIG. 4 is a circuit diagram illustrating a high-frequency switch 200 according to a second embodiment of the present invention. In addition to the transistors 7, 8, 9, and 10, the resistor 11, and the transmission line 6 of the high-frequency switch 100, the high-frequency switch 200 includes a transistor 20 that is a fourth transistor, and a transmission line 21. Further, the high-frequency switch 200 includes a control unit 201 in place of the control unit 101. A description of the same elements of the high-frequency switch 200 as those of the high-frequency switch 100 is omitted, and a description is made below as to mainly the respects in which the high-frequency switch 200 differs from the high-frequency switch 100.

A source terminal of the transistor 7 is connected to one end of the transmission line 21. The other end of the transmission line 21 is connected to the output terminal 3. That is, the source terminal of the transistor 7 is connected to the output terminal 3 via the transmission line 21. The transmission line 21 is set to have an electrical length of 90° at a center frequency of a transmitted/received signal. A drain terminal of the transistor 20 is connected to a connection between the source terminal of the transistor 7 and the transmission line 21. A source terminal of the transistor 20 is grounded. A drain terminal of the transistor 9 is connected to a connection between the other end of the transmission line 21 and the output terminal 3. A control terminal 50 is connected to gate terminals of the transistors 9 and 20. The control terminal 4 and the control terminal 50 are connected to the control unit 201.

At the time of the reception without the AGC operation, the control unit 201 of the high-frequency switch 200 illustrated in FIG. 4 controls gate voltages via the control terminal 4 and the control terminal 50, so that the transistors 7, 8, and 10 are placed in the on-state and the transistors 9 and 20 are placed in the off-state. At this time, a switching circuit defined by the transmission line 6 and the transistor 8 becomes a state in which the switching circuit cuts off a transmitted/received signal. At the time of the reception with the AGC operation and the transmission, the control unit 201 controls the gate voltages via the control terminal 4 and the control terminal 50, thereby placing the transistors 7, 8, and 10 in the off-state and placing the transistors 9 and 20 in the on-state. At this time, the switching circuit defined by the transmission line 6 and the transistor 8 becomes the state in which the switching circuit allows passage of a transmitted/received signal.

In addition to switching between the transmission and the reception, when it is determined that power of a received signal may become excessive for an LNA at the time of the reception without the AGC operation, the control unit 201 also switches between the on-state and the off-state of each of the transistors 7, 8, 9, 10, and 20 in the manner described above in order to perform the AGC operation.

Figure 5:
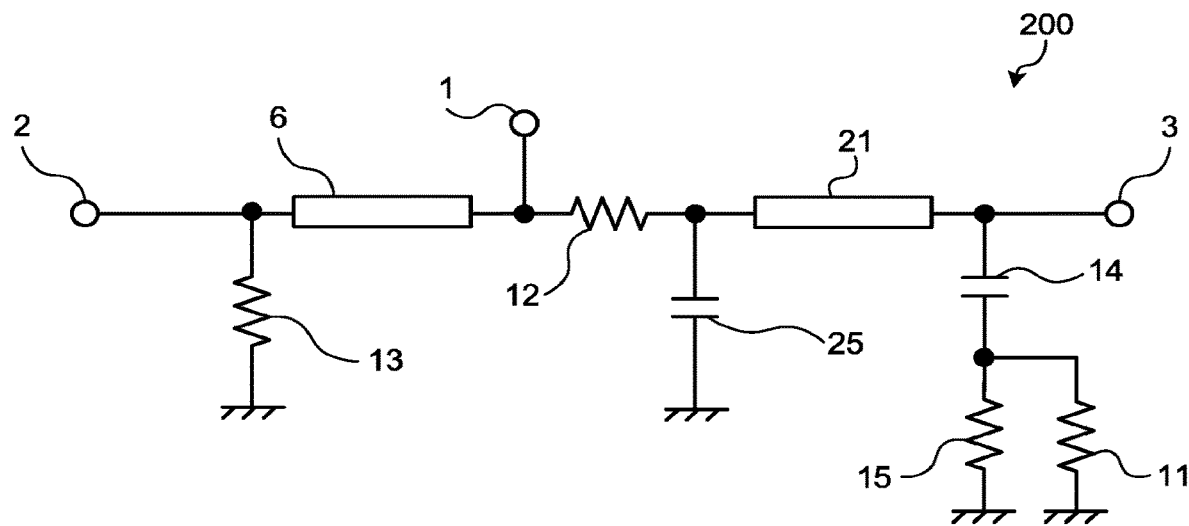
FIG. 5 is an equivalent circuit diagram of the high-frequency switch according to the second embodiment at the time of the reception without the AGC operation.

FIG. 5 is an equivalent circuit diagram of the high-frequency switch 200 according to the second embodiment at the time of the reception without the AGC operation.

The transmission line 6 is set to have an electrical length of 90° at a center frequency of a transmitted/received signal. When the on-resistance 13 of the transistor 8 is sufficiently small as compared with an impedance of the termination connected to the output terminal 2, the connected portion of the transmission line 6 to the output terminal 2 can be considered as being short-circuited and an impedance of the transmission line 6 as viewed from the input terminal 1 can be approximated to be infinite. As a result, a received signal transmitted from the input terminal 1 toward the output terminal 2 is cut off. Since an impedance of each of the off-capacitance 14 of the transistor 9 and an off-capacitance 25 of the transistor 20 is set to be sufficiently high near the center frequency of the transmitted/received signal, a received signal is transmitted from the input terminal 1 to the output terminal 3.

Figure 6:
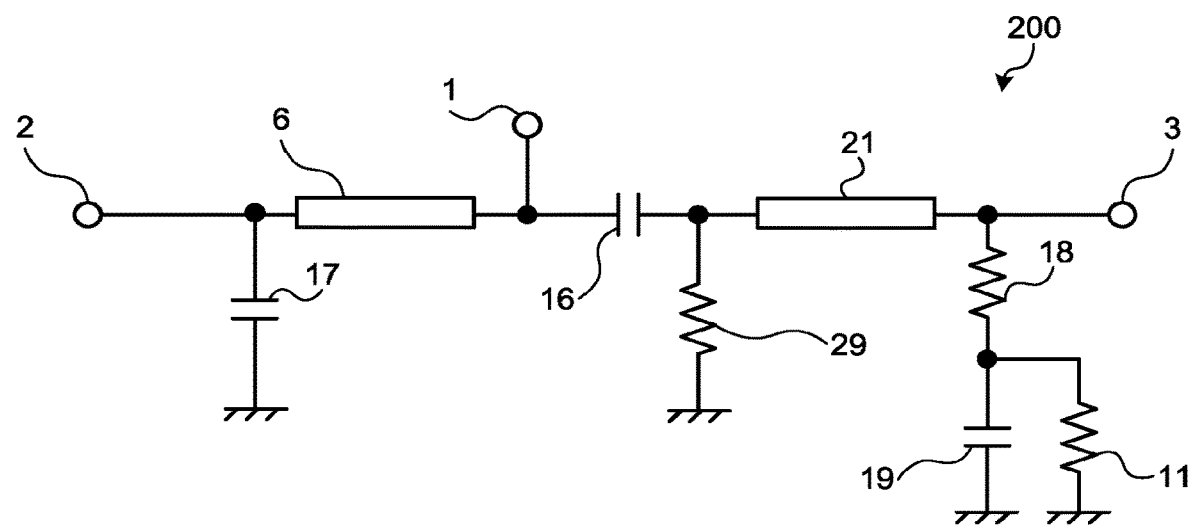
FIG. 6 is an equivalent circuit diagram of the high-frequency switch according to the second embodiment at the time of the reception with the AGC operation and transmission.

FIG. 6 is an equivalent circuit diagram of the high-frequency switch 200 according to the second embodiment at the time of the reception with the AGC operation and transmission.

An impedance of each of the off-capacitance 16 of the transistor 7 and the off-capacitance 17 of the transistor 8 is set to be sufficiently high near a center frequency of a transmitted/received signal. As a result, at the time of the transmission, a transmitted signal that is transmitted from the input terminal 1 toward the output terminal 3 is cut off, and the transmitted signal is transmitted from the input terminal 1 to the output terminal 2. Further, a received signal at the time of the reception with the AGC operation is sufficiently attenuated and is transmitted to the output terminal 3.

A transmitted signal leaking from the off-capacitance 16 of the transistor 7 is reflected as an on-resistance 29 of the transistor 20 is small enough to be considered as being short-circuited. As a result, the amount of isolation is improved as compared with the blockade achieved only by the off-capacitance 16 of the transistor 7 of the high-frequency switch 100 according to the first embodiment.

The transmission line 21 of the high-frequency switch 200 is set to have an electrical length of 90° at a center frequency of a transmitted/received signal, and an input impedance of the transmission line 21 as viewed from the input terminal 1 can be approximated to be infinite. In addition, since an impedance of the off-capacitance 19 of the transistor 10 is set to be sufficiently high near the center frequency of the transmitted/received signal, an impedance of the high-frequency switch 200 as viewed from the output terminal 3 appears to be terminated with a combined resistance of the on-resistance 18 of the transistor 9 and the resistor 11.

As described above, the high-frequency switch 200 according to the second embodiment can achieve the same advantageous effects as those produced by the high-frequency switch 100 according to the first embodiment, and can achieve an effect that the amount of isolation is improved by the on-resistance 29 of the transistor 20 at the time of the transmission or at the time of the reception with the AGC operation.

Third Embodiment

Figure 7:
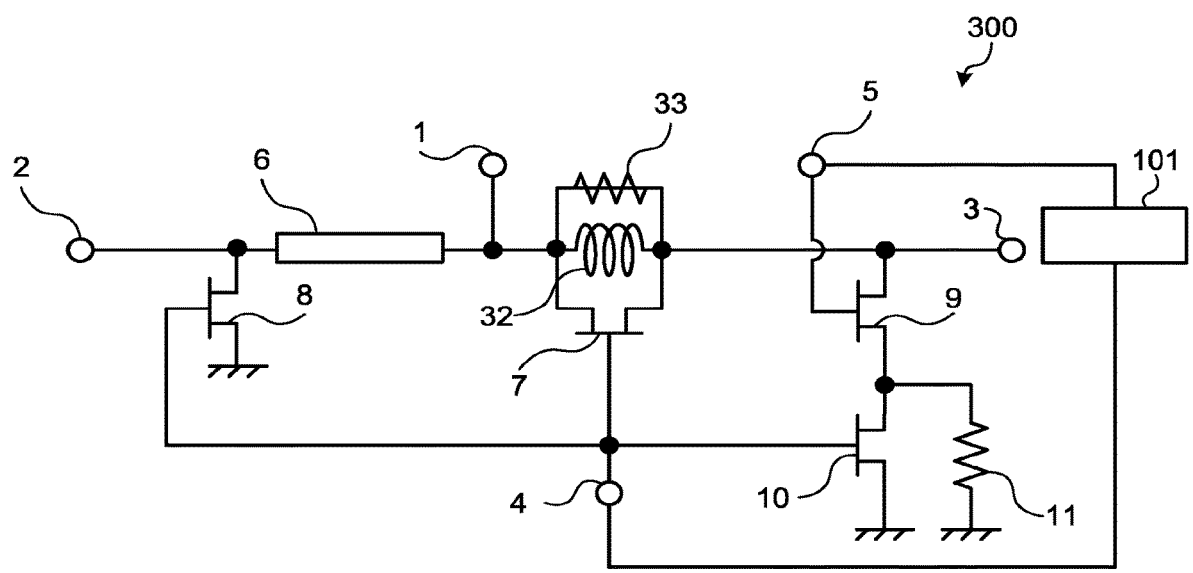
FIG. 7 is a circuit diagram illustrating a high-frequency switch according to a third embodiment of the present invention.

FIG. 7 is a circuit diagram illustrating a high-frequency switch 300 according to a third embodiment of the present invention. In addition to the transistors 7, 8, 9, and 10, the resistor 11, the transmission line 6, and the control unit 101 of the high-frequency switch 100, the high-frequency switch 300 includes an inductor 32 and a resistor 33. A description of same elements of the high-frequency switch 300 as those of the high-frequency switch 100 is omitted, and a description is made below as to mainly the respects in which the high-frequency switch 300 differs from the high-frequency switch 100.

One end of each of the inductor 32 and the resistor 33 is connected to a drain terminal of the transistor 7, and the other end of each of the inductor 32 and the resistor 33 is connected to a source terminal of the transistor 7. That is, each of the inductor 32 and the resistor 33 has its both ends connected to the drain terminal and the source terminal of the transistor 7.

At the time of the signal reception without the AGC operation, the control unit 101 of the high-frequency switch 300 illustrated in FIG. 7 controls gate voltages via the control terminal 4 and the control terminal 5, so that the transistors 7, 8, and 10 are placed in the on-state and the transistor 9 is placed in the off-state. At the time of the reception with the AGC operation and the transmission, the control unit 101 controls the gate voltages via the control terminal 4 and the control terminal 5, thereby placing the transistors 7, 8, and 10 in the off-state and placing the transistor 9 in the on-state.

Figure 8:
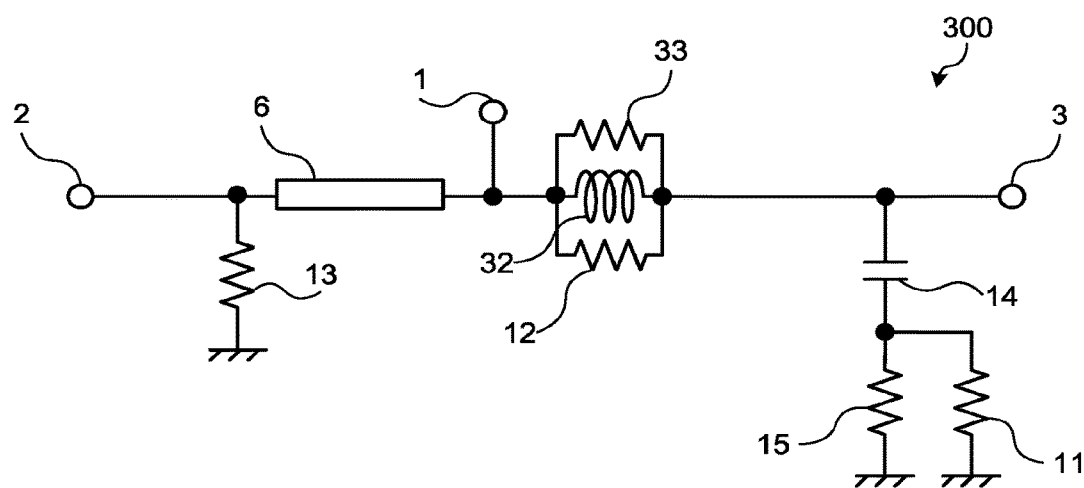
FIG. 8 is an equivalent circuit diagram of the high-frequency switch according to the third embodiment at the time of the signal reception without the AGC operation.

FIG. 8 is an equivalent circuit diagram of the high-frequency switch 300 according to the third embodiment at the time of the signal reception without the AGC operation.

The transmission line 6 is set to have an electrical length of 90° at a center frequency of a transmitted/received signal. When the on-resistance 13 of the transistor 8 is sufficiently small as compared with an impedance of the termination connected to the output terminal 2, the connected portion of the transmission line 6 to the output terminal 2 can be considered as being short-circuited and an impedance of the transmission line 6 as viewed from the input terminal 1 can be approximated to be infinite. As a result, a received signal transmitted from the input terminal 1 to the output terminal 2 is cut off. In addition, an impedance of the off-capacitance 14 of the transistor 9 is set to be sufficiently high near the center frequency of the transmitted/received signal, and the received signal is transmitted from the input terminal 1 to the output terminal 3. Since the on-resistance 12 of the transistor 7 is sufficiently small, an influence of loss by the inductor 32 and the resistor 33 connected in parallel to each other can be ignored.

Figure 9:
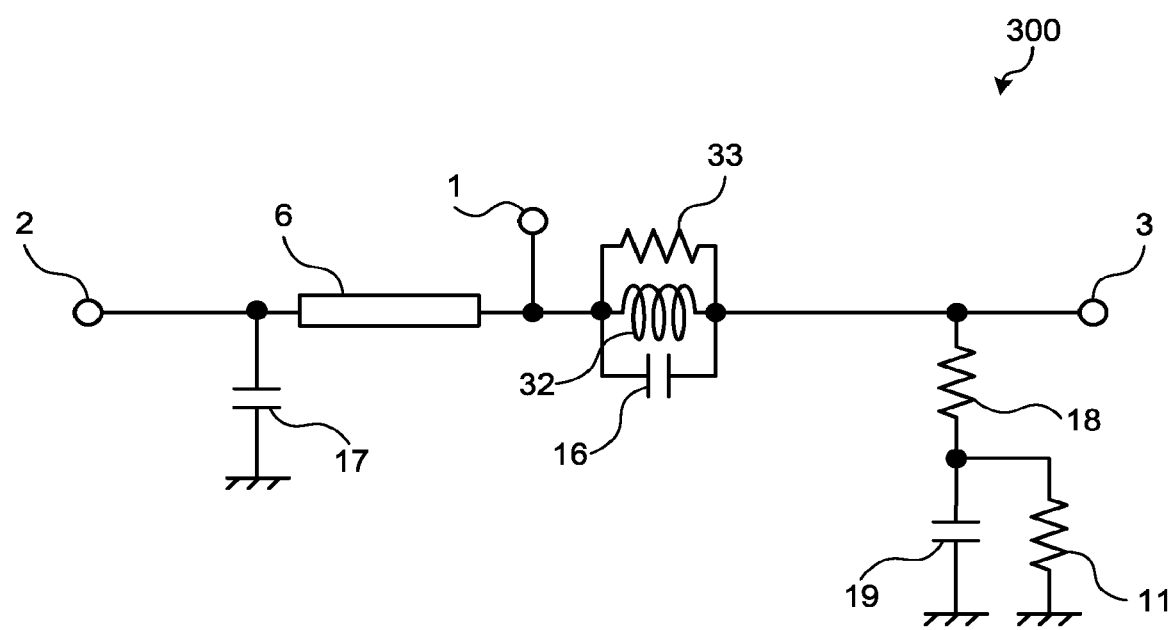
FIG. 9 is an equivalent circuit diagram of the high-frequency switch according to the third embodiment at the time of the reception with the AGC operation and transmission.

FIG. 9 is an equivalent circuit diagram of the high-frequency switch 300 according to the third embodiment at the time of the reception with the AGC operation and the transmission.

Since the off-capacitance 16 of the transistor 7 and the inductor 32 are set to cause parallel resonance at a center frequency of a transmitted/received signal, the blockade between the input terminal 1 and the output terminal 3 occurs. In addition, since an impedance of the off-capacitance 17 of the transistor 8 is set to be sufficiently high near the center frequency of the transmitted/received signal, a transmitted signal at the time of the transmission is transmitted from the input terminal 1 to the output terminal 2. Further, a received signal at the time of the reception with the AGC operation is sufficiently attenuated and is transmitted to the output terminal 3.

The resistor 33 connected in parallel to a resonant circuit defined by the off-capacitance 16 of the transistor 7 and the inductor 32 has a function of lowering a Q factor of this resonant circuit to make isolation characteristics wider. Since an impedance of the resonant circuit defined by the off-capacitance 16 and the inductor 32 can be approximated to be infinite and the off-capacitance 19 of the transistor 10 is set to have a sufficiently high impedance near the center frequency of the transmitted/received signal, an impedance of the high-frequency switch 300 as viewed from the output terminal 3 appears to be terminated with a combined resistance of the on-resistance 18 of the transistor 9 and the resistor 11.

As described above, the high-frequency switch 300 according to the third embodiment can achieve the same effects as those produced by the high-frequency switch 100 according to the first embodiment, and can achieve an effect that the amount of isolation is improved by the resonant circuit defined by the off-capacitance 16 of the transistor 7 and the inductor 32. Since the high-frequency switch 300 does not require the transmission line 21 used in the high-frequency switch 200 according to the second embodiment, the high-frequency switch 300 has advantages that the scale of the circuit of the high-frequency switch 300 is downsized and the line loss is reduced, as compared with the high-frequency switch 200.

The configurations described in the above embodiments are only examples of the content of the present invention. The configurations can be combined with other well-known techniques, and a part of each configuration can be omitted or modified without departing from the scope of the present invention.

REFERENCE SIGNS LIST 1 input terminal, 2, 3 output terminal, 4, 5, control terminal, 6, 21 transmission line, 7, 8, 9, 10, transistor, 11, 33 resistor, 12, 13, 15, 18, 29 on-resistance, 14, 16, 17, 19, 25 off-capacitance, 32 inductor, 100, 200, 300 high-frequency switch, 101, 201 control unit.

The invention claimed is:

1. A high-frequency switch comprising:
a first transistor having a drain terminal connected to an input terminal, and a source terminal connected to a first output terminal;
a second transistor having a drain terminal connected to the first output terminal;
a third transistor having a drain terminal connected to a source terminal of the second transistor, and a grounded source terminal;
a resistor having one end connected to a connection between the source terminal of the second transistor and the drain terminal of the third transistor, and another end grounded;
a switching circuit connected between the input terminal and a second output terminal, the switching circuit being switchable between a state in which the switching circuit allows passage of a transmitted/received signal between the input terminal and the second output terminal and a state in which the switching circuit cuts off the transmitted/received signal; and
a controller to control the first transistor, the second transistor, the third transistor, and the switching circuit, wherein
at a time of reception without an automatic gain control operation, the controller brings the switching circuit into the state in which the switching circuit cuts off the transmitted/received signal, places the first transistor and the third transistor in an on-state, and places the second transistor in an off-state, and
at a time of transmission and reception with the automatic gain control operation, the controller brings the switching circuit into the state in which the switching circuit allows the passage of the transmitted/received signal, places the first transistor and the third transistor in an off-state, and places the second transistor in an on-state.

2. The high-frequency switch according to claim 1, wherein
the source terminal of the first transistor is connected to the first output terminal via a transmission line that is set to have an electrical length of 90° at a center frequency of the transmitted/received signal, and
the high-frequency switch further comprises a fourth transistor having a drain terminal connected to a connection between the source terminal of the first transistor and the transmission line, and a grounded source terminal.

3. The high-frequency switch according to claim 1, further comprising an inductor having both ends connected to the drain terminal of the first transistor and the source terminal of the first transistor, wherein
an off-capacitance of the first transistor and the inductor cause parallel resonance at a center frequency of the transmitted/received signal.

4. The high-frequency switch according to claim 3, further comprising a resistor having both ends connected to the drain terminal of the first transistor and the source terminal of the first transistor.

* * * * *